United States Patent [19]

Yamamoto et al.

[11] Patent Number: 4,773,077
[45] Date of Patent: Sep. 20, 1988

[54] INTERNAL REFLECTION INTERFEROMETRIC SEMICONDUCTOR LASER APPARATUS

[75] Inventors: Osamu Yamamoto, Nara; Hiroshi Hayashi, Kyoto; Saburo Yamamoto, Nara, all of Japan

[73] Assignee: Sharp Kabushiki Kaisha, Osaka, Japan

[21] Appl. No.: 874,601

[22] Filed: Jun. 16, 1986

[30] Foreign Application Priority Data

Jun. 18, 1985 [JP] Japan .................. 60-134867

[51] Int. Cl.⁴ .............................. H01S 3/19
[52] U.S. Cl. ....................... 372/92; 372/46; 372/48; 372/50
[58] Field of Search .............. 372/92, 44, 45, 46, 372/48, 50

[56] References Cited

FOREIGN PATENT DOCUMENTS 0108562 5/1984 European Pat. Off. .
0111391 7/1983 Japan ..................... 372/92

OTHER PUBLICATIONS

Fattah et al, "Semiconductor Interferometric Laser", Appl. Phys Lett., 41(2), Jul. 1982, pp. 112-114.
Applied Physics Letters, vol. 42, No. 7, 1st Apr. 1983, pp. 562-564, American Inst. of Physics, New York, US; ARSAM Antreasyan et al.
Applied Physics Letters, vol. 40, No. 7, Apr. 1, 1982, pp. 571-573, American Inst. of Physics, New York, US; Hong K. Choi et al.
Patent Abstracts of Japan, vol. No. 218 (E-200) [1363], 28th Sep. 1983; & JP-A-58 111 391 (Hitachi Seisakusho K.K.), 02-07-1983.

Primary Examiner—James W. Davie
Attorney, Agent, or Firm—Ciotti, Murashige, Irell & Manella

[57] ABSTRACT

A semiconductor laser apparatus comprising: a semiconductor laser chip with a first light-emitting facet and a second light-emitting facet containing an interference effect-creating means therein for creating an interference effect within the resonator(s) thereof, a laser light-reflecting means for returning a part of the laser light emitted from the first light-emitting facet of said semiconductor laser chip to the first light-emitting facet, and a mounting base on which said semiconductor laser chip and said laser light-reflecting means are fixed in a parallel manner.

3 Claims, 4 Drawing Sheets

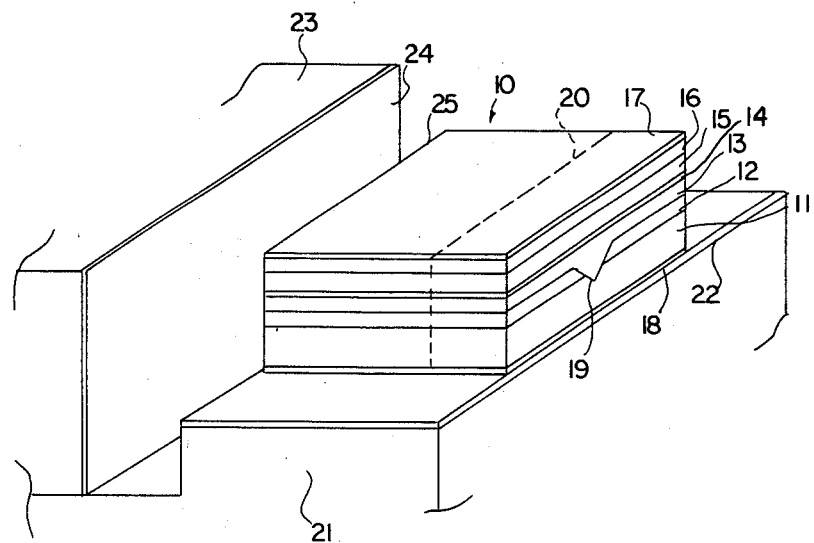
FIG. I(A)
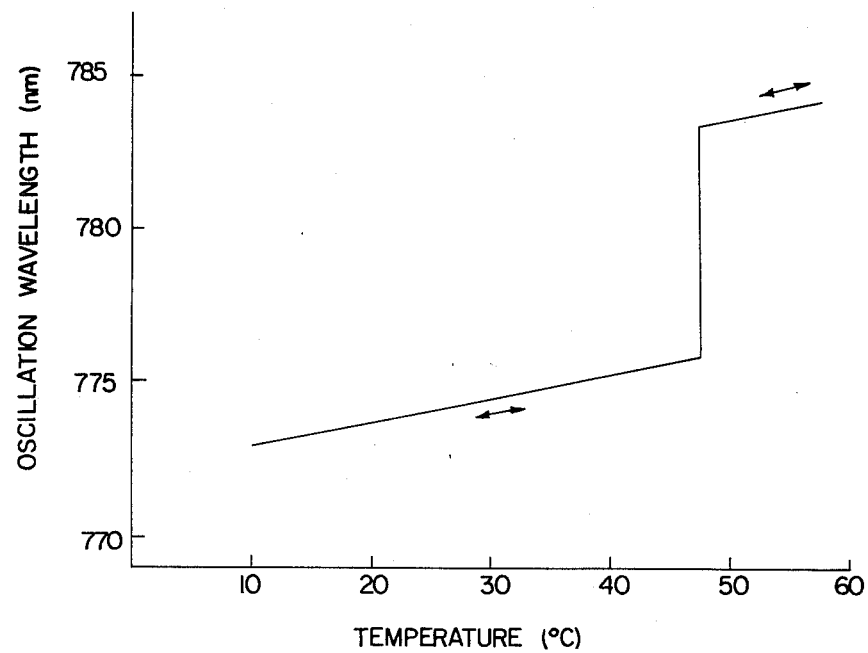
FIG. I(B)

INTERNAL REFLECTION INTERFEROMETRIC SEMICONDUCTOR LASER APPARATUS

BACKGROUND OF THE INVENTION

1. Field of the Invention

This invention relates to a semiconductor laser apparatus which attains laser oscillation with a stabilized oscillation wavelength.

2. Description of the Prior Art

Semiconductor laser devices which are mass produced can attain laser oscillation at a low threshold current and obtain considerably satisfactory results in characteristics such as the fundamental transverse mode, the single longitudinal mode, long life, etc., but they have problems with regard to a stabilized oscillation wavelength (i.e., the stabilized longitudinal mode) in that the oscillation wavelength varies continuously or discontinuously depending upon a variation in temperature and/or current, resulting in optical output noise which is noticeable when the laser devices are exposed to light and/or a reflected laser light from the laser devices.

In order to eliminate the above-mentioned problems and to stabilize the longitudinal oscillation mode, the suppression of mode hopping (i.e., changes in the longitudinal oscillation mode) has been tried over a wide range of temperatures by the following approaches:

The first approach for the suppression of mode hopping is the use of diffraction grating type lasers such as distributed feedback (DFB) lasers, distributed Bragg reflector (DBR) lasers, etc., which have diffraction gratings in the waveguide. These laser devices are excellent in wavelength selectivity due to the periodicity of the diffraction gratings, so that they can attain the stabilization of the longitudinal mode over a wide range of temperatures. However, their production process is complicated and it is difficult to use some semiconductor laser materials (e.g., materials which are readily oxidized).

Second, compound resonator type lasers including cleaved coupled cavity lasers (in which two semiconductor lasers are coupled by their facets and/or which are separated into two laser-operating areas by an etching technique) are used. The two semiconductor lasers operate independently, resulting in the synchronization of their wavelengths, making possible the stabilization of the longitudinal mode. However, their operation relies upon the skill of skilled workers, and moreover small changes in the spacing between the two laser devices cause changes in the longitudinal mode, resulting in optical output noise.

Third, the reflective index of each of both facets of a semiconductor laser device is made high to increase the internal optical density of the device, resulting in the suppression of the non-oscillation mode, thereby attaining stable oscillation in a longitudinal mode notwithstanding changes in temperatures.

Fourth, the concentration of Te, etc., to be doped into the n-cladding layer of a semiconductor laser device is set at a high level resulting in a supersaturated absorber by which loss-gratings are formed, whereby the suppression of the non-oscillation mode is attained and stable laser oscillation is attained in a longitudinal mode notwithstanding changes in temperatures.

Although the third and fourth approaches provide stable oscillation in a longitudinal mode regardless of changes in temperatures to a certain extent, mode hopping occurs not only when temperatures rise beyond a certain value, but also when temperatures fall beyond a certain value. That is, mode-hopping hysteresis occurs, causing a limitation in the range of temperatures and/or currents used.

Fifth, internal reflector interferometric lasers having a reflecting area inside thereof are used. These laser devices have a waveguide which provides one or more regions having different effective refractive index in which reflection occurs resulting in an interference effect. Such an interference effect results in the stabilization of a longitudinal mode. In order to create a difference in the refractive index, the thickness of the active layer must be made uneven and/or semiconductor crystal materials having a different composition ratio must be used for the formation of the laser devices.

The sixth approach is that two or more waveguides having different effective cavity lengths are optically coupled therebetween, resulting in an interference effect, which makes possible the stabilization of a longitudinal mode. Examples of these laser devices are OEMI lasers (I. H. A. Fattah et al., Appl. Phys. Lett., 41(2), 112, 1982) etc.

Although the fifth and sixth approaches allow the stabilization of a longitudinal mode at a temperature in the range of several degrees to several tens of degrees, it is impossible to stabilize the longitudinal mode with reproducibility over a wider range of temperatures. That is, although the suppression of a limited number (e.g., 4 or 5) of the longitudinal modes which are adjacent to the oscillation longitudinal mode is possible, the internal reflectivity of these laser devices are so insufficient that a greater number of adjacent modes cannot be suppressed, making it difficult to put them into practical use.

Seventh, external resonator type lasers are used, wherein laser light emitted from one of the facets of the laser device is reflected by an external reflector to return to the facet of the laser device, resulting in an interference effect between the external mode based on the distance from the facet of the laser device to the external reflector (i.e., the external cavity length) and the longitudinal mode based on the distance from one facet of the laser device to the other thereof (i.e., the internal cavity length of the laser device). The stabilization of a longitudinal mode can be attained by utilizing such an interference effect. The selectivity of the longitudinal mode in the seventh approach depends upon the external cavity length and the amount of reflected light. In order to increase the amount of reflected light, a semiconductor laser apparatus shown in FIG. 3 has been proposed, wherein a lens 2 is disposed between the laser device 1 and the external reflector 3 in such a manner that laser light emitted from the laser device is incident upon the external reflector 3 through the lens 2 and then reflected to return to the laser device 1 through the lens 2. The laser device 1 is fixed on a mounting base 4. Since the external cavity length (L) unavoidably becomes long due to the above-mentioned structure, the external mode interval $\Delta\lambda e$ ($=\lambda_0^2/2L$, wherein $\lambda_0$ is the central wavelength) becomes small, so that stable oscillation in a longitudinal mode cannot be attained. Although laser light emitted from the laser device can be returned to the laser device by a concave reflector, the production process of such a laser apparatus is complicated and it is difficult to position the facet of the laser device at the center of the concave reflector.

The inventors of this invention designed a semiconductor laser apparatus in which a plane reflector is positioned to face one facet of the laser device in a parallel manner at the distance of 100 μm therebetween (i.e., with an external cavity length of 100 μm), and stable laser oscillation was attained in a longitudinal mode over a range of about 10° C. In order to further expand the temperature range, the inventors tried to shorten the external cavity length and measured changes in the oscillation wavelength when temperatures are changed at an optical output power of 3 mW, resulting in the characteristic curve (FIG. 4) showing the relationship between the temperatures and the oscillation wavelengths. FIG. 4 indicates that mode hopping successively occurs from one longitudinal mode to the adjacent longitudinal mode in each of the A and B zones of oscillation wavelengths, which makes the stabilization of laser oscillation in a longitudinal mode impossible. More particularly, FIG. 4 indicates that mode hopping successively occurs from the initial longitudinal mode to the adjacent longitudinal mode at the a points at which the temperature rises and the other mode hopping occurs to return to the initial longitudinal mode at the b points at which the temperature falls. That is, mode hopping hysteresis phenomenon arises with changes in temperature.

As mentioned above, semiconductor lasers which stably oscillate in a single longitudinal mode over a wide range of temperatures and which are readily produced have not yet been proposed at present.

SUMMARY OF THE INVENTION

The semiconductor laser apparatus of this invention, which overcomes the above-discussed and numerous other disadvantages and deficiencies of the prior art, comprises a semiconductor laser chip with a first light-emitting facet and a second light-emitting facet containing an interference effect-creating means therein for creating an interference effect within the resonator(s) thereof, a laser light-reflecting means for returning a part of the laser light emitted from the first light-emitting facet of said semiconductor laser chip to the first light-emitting facet, and a mounting base on which said semiconductor laser chip and said laser light-reflecting means are fixed in a parallel manner.

The interference effect-creating means is, in a preferred embodiment, composed of an area of the active layer having a different thickness in the central area of the resonator.

The interference effect-creating means is, in a preferred embodiment, composed of resonators having different cavity lengths in which a part of the waveguide in one resonator is common to that of the waveguide in the other resonator from the second light-emitting facet to the branching portion and the other parts of the waveguides in the resonators are branched at said branch portion.

Thus, the invention described herein makes possible the objects of (1) providing a semiconductor laser apparatus which stably oscillates in a single longitudinal mode over a wide range of temperatures; (2) providing a semiconductor laser apparatus which attains stable laser oscillation with a desired oscillation wavelength by precise control of temperatures and/or currents; (3) providing a semiconductor laser apparatus in which optical output noise due to unstable longitudinal modes can be suppressed; and (4) providing a semiconductor laser apparatus which stably attains a single longitudinal mode regardless modulation arising.

BRIEF DESCRIPTION OF THE DRAWINGS

This invention may be better understood and its numerous objects and advantages will become apparent to those skilled in the art by reference to the accompanying drawings as follows:

FIG. 1(A) is a perspective view showing the main portion of a semiconductor laser apparatus of this invention.

FIG. 1(B) is a characteristic curve showing the relationship between the temperatures and the oscillation wavelengths with regard to the apparatus shown in FIG. 1(A).

DESCRIPTION OF THE PREFERRED EMBODIMENTS

The semiconductor laser apparatus of this invention comprises:

an internal reflector interferometric laser chip having an internal reflection-creating means for creating an internal reflection at at least one portion within the resonator thereof so as to suppress the adjacent longitudinal modes resulting in the stabilization of the main longitudinal mode, or a semiconductor laser chip having a laser oscillation area composed of two or more coupled waveguides to create an interference effect due to the difference in their waveguide length, thereby attaining the suppression of the adjacent longitudinal modes so as to stabilize the main longitudinal mode, and a laser light-reflecting means for returning a part of the laser light emitted from one facet of said semiconductor laser chip to said facet.

Figure 4:
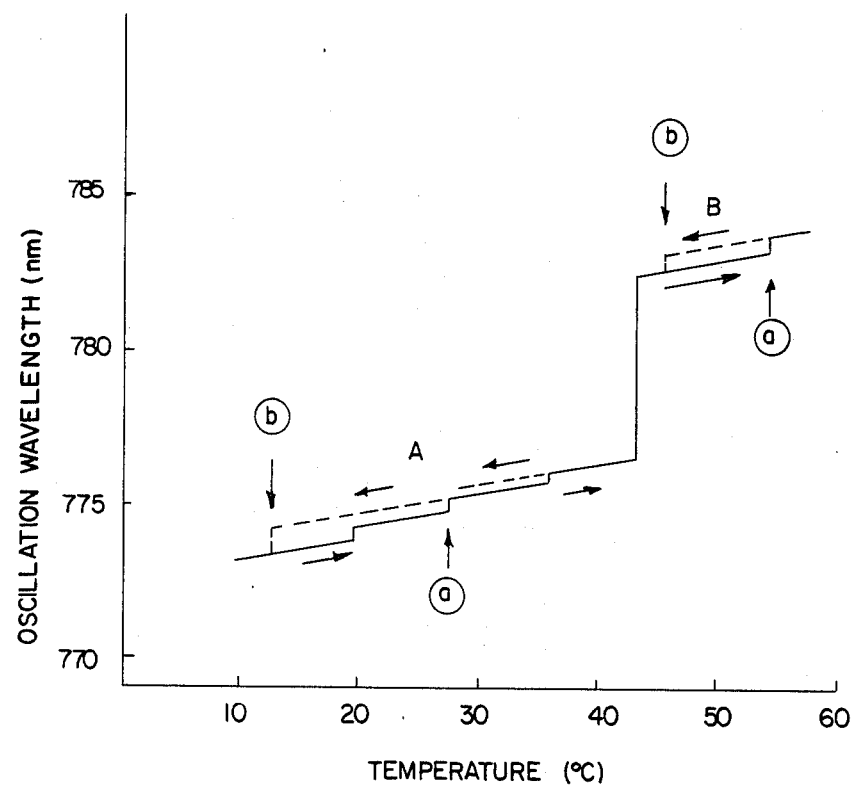
FIG. 4 is a characteristic curve showing the relationship between the temperatures and the oscillation wavelengths with regard to a conventional semiconductor laser apparatus.
Figure 5A:
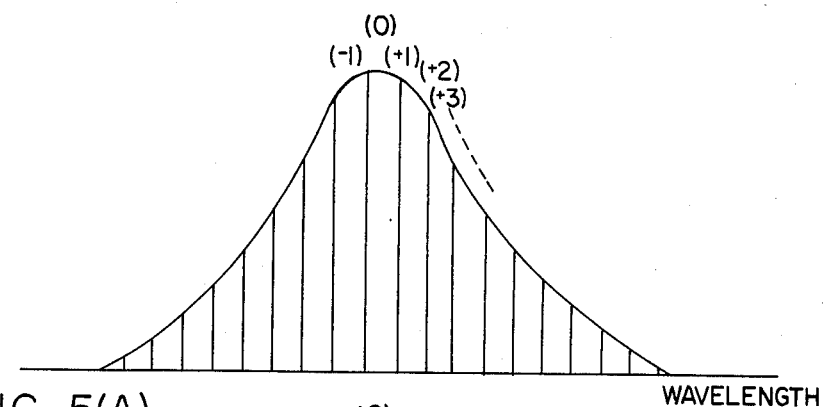
FIGS. 5(A) to 5(D) are schematic diagrams illustrating the principle of the stabilization of a longitudinal mode according to this invention.
Figure 5B:
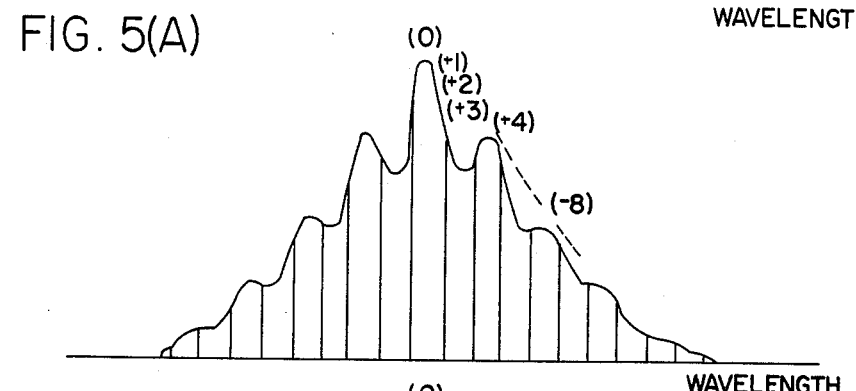
Figure 5C:
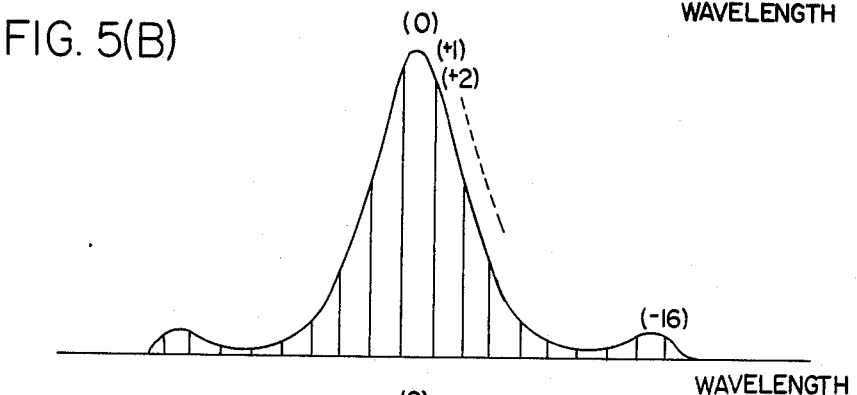
Figure 5D:
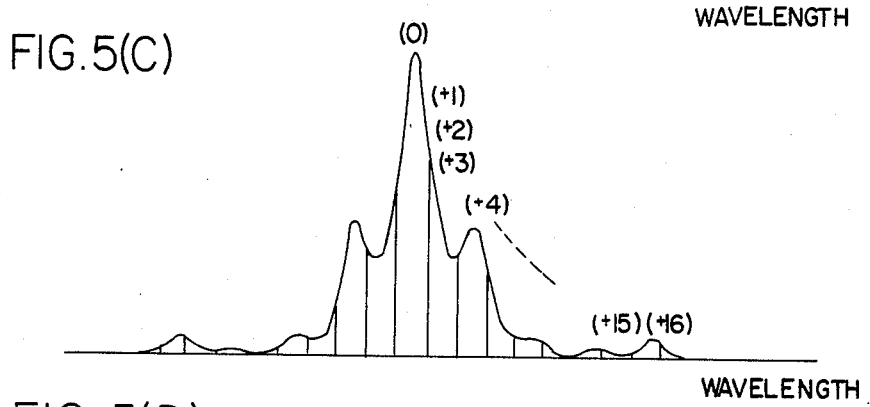

The principle of the stabilization of a longitudinal mode according to this invention is explained by reference to FIGS. 5(A) to 5(D) as follows:

FIG. 5(A) shows the spectra near the oscillation threshold value of a conventional ordinary semiconductor laser device, indicating that the main oscillation mode <0> is successively shifted to the adjacent modes <+1>, <+2>, ... positioned at the longer wavelength side as temperatures rise. FIG. 5(B) shows the spectra near the oscillation threshold value of a conventional internal reflector interferometric laser device, indicating that stable oscillation in the longitudinal mode <0> is allowed to continue until mode hopping is carried out to the longitudinal mode <+4> even though the gain peak is shifted with a variation in temperature since the adjacent longitudinal modes <+1>, <+2> and <+3> are suppressed by the interference effect. FIG. 5(C) shows the spectra near the oscillation threshold value of a conventional ordinary semiconductor laser device provided with an external resonator, indicating that although the external mode <+16> ranks next to the main mode <0>, since the adjacent modes <+1>, <+2>, ..., and <+15> are insufficiently suppressed, mode hopping occurs as the gain peak is shifted, resulting in the characteristic curve shown in FIG. 4. Semiconductor laser devices in which two or more waveguides are coupled therebetween exhibit the same characteristics as in FIGS. 4 and 5(C). FIG. 5(D) shows the spectra near the oscillation threshold value of a semiconductor laser apparatus of this invention, indicating the the suppression of the longitudinal modes from <+1> to <+15> can be effectively achieved due to both the interference effect of the semiconductor laser chip and the interference effect of the external resonator, and stable oscillation in the main oscillation mode <0> is allowed to continue until mode hopping is carried out to the longitudinal mode <+16> even though the gain peak is shifted with a variation in temperature.

As mentioned above, this invention provides a semiconductor laser apparatus which stably oscillates in a single longitudinal mode over a wide range of temperatures.

EXAMPLE 1

FIG. 1(A) shows a semiconductor laser apparatus of this invention, which comprises a semiconductor laser chip 10 and an external reflector 23 both of which are fixed on a single mounting base 21 in such a manner that the light-emitting rear facet 25 of the semiconductor laser chip 10 faces the reflecting face 24 of the external reflector 23 in a parallel manner at a limited distance therebetween.

The semiconductor laser chip 10 is produced as follows: On a p-GaAs substrate 11, an n-GaAs current blocking layer 12 is formed by liquid phase epitaxy. Then, a V-striped channel 19 is formed in the current blocking layer 12 in a manner to reach the substrate 11, resulting in a current path. On the current blocking layer 12 including the V-channel 19, a p-GaAlAs cladding layer 13, a GaAlAs active layer 14 for laser oscillation, an n-GaAlAs cladding layer 15, and an n-GaAs cap layer 16 for achieving an ohmic contact with an electrode are successively formed by liquid phase epitaxy, resulting in a double-heterostructure multi-layered crystal for laser oscillation. Then, an n-sided electrode 17 and a p-sided electrode 18 are formed on the upper face of the cap layer 16 and the back face of the substrate 11, respectively. The thickness of the portion of the active layer 14 corresponding to the waveguide indicated by dotted line 20 shown in FIG. 1(A) is different from that of the other portion of the active layer 14 (e.g., the thickness of said portion of the active layer 14 is thinner than that of the other portion thereof), causing an internal reflection.

The semiconductor laser chip 10 having the above-mentioned structure is fixed on the mounting base 21 by a solder such as In, etc., in such a manner that the light-emitting rear facet 25 thereof faces the reflecting face 24 of the external reflector 23 in a parallel manner with a distance of approximately 24 μm therebetween.

When current is injected into the semiconductor laser chip 10 through the n-sided electrode 17 and the p-sided electrode 18, it flows through the current path (i.e., the striped channel 19) alone and laser oscillation begins within the portion of the active layer 14 positioned above the current path. An internal reflection arises in the portion of the active layer 14 indicated by the dotted line 20. Laser light emitted from the light-emitting rear facet 25 of the semiconductor laser chip 10 is reflected by the reflecting face 24 of the reflector 23 so as to return to the semiconductor laser chip 10.

The oscillation wavelengths were measured with changes in temperatures in the case where the output power at the front facet of the semiconductor laser chip 10 was 3 mW, resulting in the characteristic curve (FIG. 1(B)) showing the relationship between the temperatures and the oscillation wavelengths, indicating that the oscillation wavelegnth is stable at temperatures even over 45° C., and moreover laser oscillation when temperatures rise is achieved in the same longitudinal mode as that when temperatures fall, that is mode hopping hysteresis does not occur.

EXAMPLE 2

Figure 2:
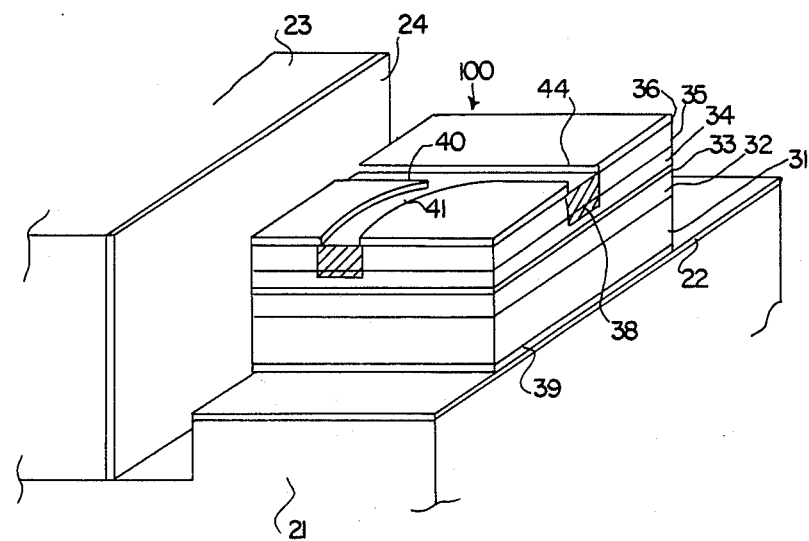
FIG. 2 is a perspective view showing the main portion of another semiconductor laser apparatus of this invention.
Figure 3:
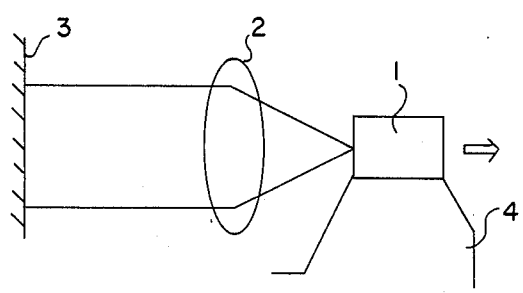
FIG. 3 is a diagram showing a conventional laser light-feedback type semiconductor laser.

FIG. 2 shows another semiconductor laser apparatus of this invention, which is the same structure as in Example 1 except that the semiconductor laser chip is provided with two waveguides which are different in their length.

The semiconductor laser chip 100 is produced as follows: On an n-GaAs substrate 31, an n-GaAlAs cladding layer 32, a GaAlAs active layer 33, a p-GaAlAs cladding layer 34, and an n-GaAlAs cap layer 35 are successively formed by liquid phase epitaxy. Then, a SiO$_2$ film 36 is coated on the surface area of the cap layer 35 except for the portions corresponding to a striped current path to be formed by the succeeding process, resulting in a striped channel 44 reaching the cap layer 35 and consisting of a rectilinear channel 40, which runs between the rear facet and the front facet, and a branching channel 41, which branches in the central area of the rectilinear channel 40 and runs with a gentle curve to the side facet. Then, Zn is diffused into the striped channel 44, resulting in a p-reverse layer 38, from the n-cap layer 35 to the p-cladding layer 34, which functions as a current path. Then, a p-sided electrode (not shown) is formed on the striped channel 44 and the oxide film 36 and an n-sided electrode 39 is formed on the back face of the GaAs substrate 31.

The semiconductor laser chip 100 having the above-mentioned structure is fixed on a mounting base 22 by a solder such as In, etc., in such a manner that the light-emitting rear facet of the semiconductor laser chip 100 faces the reflecting face 24 of the external reflector 23 in a parallel manner.

When current is injected into the semiconductor laser chip 100 through the p-sided electrode (not shown) and the n-sided electrode 39, it flows through the current path (i.e., the Zn-diffusion area 38) alone and laser oscillation begins in each of the resonators formed within the areas of the active layer 33 positioned below the striped rectilinear channel 40 and the striped branching channel 41. Although the front facet of the resonator corresponding to the striped rectilinear channel 40 is common to that of the resonator corresponding to the striped branching channel 41, the cavity length from the front facet to the rear facet is different therebetween so that the interference effect shown in FIG. 5(B) arises, which allows the same stabilized longitudinal mode as in Example 1.

This invention can provide the same results as shown in FIG. 5(D) even when the interference effect shown in FIG. 5(B), which is achieved by the semiconductor laser chip and by which mode hopping is suppressed with a narrow pitch, is exchanged for the interference effect shown in FIG. 5(C), which is achieved by the external resonator and by which mode hopping is suppressed with a wide pitch. Selected reflective indexes of the light-emitting rear facet of the semiconductor laser chip and/or the reflecting face of the external reflector should allow the more noticeable stabilization of a longitudinal mode.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser apparatus comprising a semiconductor laser chip, said semiconductor laser chip is of an internal reflector interferometric type, has a first light-emitting facet and a second light-emitting facet, and contains an interference effect-creating means therein for creating an interference effect within the resonator(s) thereof, and further, a laser light-reflecting means for returning a part of the laser light emitted from the first light-emitting facet of said semiconductor laser chip to the first light-emitting facet, and a mounting base on which said semiconductor laser chip and said laser light-reflecting means are fixed in a parallel manner are provided.

2. A semiconductor laser apparatus according to claim 1, wherein said interference effect-creating means is composed of an area of the active layer having a different thickness in the central area of the resonator.

3. A semiconductor laser apparatus according to claim 1, wherein said interference effect-creating means is composed of resonators having different cavity lengths in which a part of the waveguide in one resonator is common to that of the waveguide in the other resonator from the second light-emitting facet to the branching portion and the other parts of the waveguides in the resonators are branched at said branch portion.

* * * * *